(12) United States Patent
Leng et al.

(10) Patent No.: US 12,532,409 B2
(45) Date of Patent: Jan. 20, 2026

(54) CIRCUIT BOARD

(71) Applicant: NIKO SEMICONDUCTOR CO., LTD., New Taipei (TW)

(72) Inventors: Chung-Ming Leng, New Taipei (TW); Chih-Cheng Hsieh, Taoyuan (TW); Wei-Lun Wang, New Taipei (TW); Pin-Rui Huang, New Taipei (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 133 days.

(21) Appl. No.: 18/207,230

(22) Filed: Jun. 8, 2023

(65) Prior Publication Data

US 2024/0224414 A1    Jul. 4, 2024

(30) Foreign Application Priority Data

Dec. 30, 2022    (TW) .................................. 111150809

(51) Int. Cl.
*H05K 1/02* (2006.01)
*H05K 1/18* (2006.01)

(52) U.S. Cl.
CPC ............ *H05K 1/0271* (2013.01); *H05K 1/18* (2013.01); *H05K 1/0227* (2013.01); *H05K 2201/09972* (2013.01); *H05K 2201/10439* (2013.01)

(58) Field of Classification Search
CPC .................. H05K 1/0271; H05K 1/18; H05K 2201/09972; H05K 2201/10439
See application file for complete search history.

(56) References Cited

U.S. PATENT DOCUMENTS

| | | | | |
|---|---|---|---|---|
| 5,475,606 A | * | 12/1995 | Muyshondt | H05K 1/0218 174/257 |
| 5,912,809 A | * | 6/1999 | Steigerwald | H05K 1/0262 174/262 |
| 7,326,858 B2 | * | 2/2008 | Lee | H05K 1/162 174/262 |
| 7,663,063 B2 | * | 2/2010 | Lin | H05K 1/0253 174/255 |
| 2008/0164588 A1 | * | 7/2008 | Lee | H01L 24/49 257/668 |
| 2013/0015565 A1 | | 1/2013 | Lin | |

FOREIGN PATENT DOCUMENTS

| | | |
|---|---|---|
| CN | 103402303 A | 11/2013 |
| CN | 113115522 A | 7/2021 |
| CN | 113133190 A | 7/2021 |
| TW | 201304624 A1 | 1/2013 |

* cited by examiner

*Primary Examiner* — Ishwarbhai B Patel
(74) *Attorney, Agent, or Firm* — Li & Cai Intellectual Property (USA) Office

(57) ABSTRACT

A circuit board includes a substrate and a first metal circuit layer. The substrate has an upper surface and a lower surface opposite to the upper surface. The first metal circuit layer is located on the upper surface, and the first metal circuit layer includes a first line area and a second line area. The first line area and the second line area are separated by a groove area, and the groove area includes a bent section. Accordingly, the risk of detachment between the first metal circuit layer and the substrate due to stress concentration on the circuit board can be reduced.

15 Claims, 8 Drawing Sheets

CIRCUIT BOARD

CROSS-REFERENCE TO RELATED PATENT APPLICATION

This application claims the benefit of priority to Taiwan Patent Application No. 111150809, filed on Dec. 30, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a circuit board, and more particularly to a circuit board having a structure capable of eliminating or reducing stress concentration.

BACKGROUND OF THE DISCLOSURE

A circuit substrate is an important component of an electronic product, and is also a support of an electronic component. By disposing a metal circuit on the substrate and designing each layer to connect and conduct relevant components, a complete electronic product can be produced.

However, after the metal circuit is laid on the substrate, the metal circuit may be subjected to external stress. Since stress concentration is formed on an edge of the metal circuit, delamination or separation of the metal circuit and the substrate may occur, such that a conductive function is disabled.

In addition, the circuit substrate may be in a high temperature environment due to heat energy generated by the electronic components during operation. Since thermal coefficients of the metal circuit and the substrate are different, an interface between the substrate and the metal circuit will warp, and thermal stress concentration formed on the edge of the metal circuit will cause the above-mentioned delamination or separation of the metal circuit and the substrate.

Therefore, how to enhance the strength of a circuit board through an improvement in structural design, so as to overcome the above-mentioned deficiencies caused by the stress concentration, has become one of the important issues to be addressed in the industry.

SUMMARY OF THE DISCLOSURE

In response to the above-referenced technical inadequacies, the present disclosure provides a circuit board, which includes: a substrate and a first metal circuit layer. The substrate has an upper surface and a lower surface opposite to the upper surface, and the first metal circuit layer is located on the upper surface. The first metal circuit layer includes a first line area and a second line area. The first line area and the second line area are separated by a groove area, and the groove area includes a bent section.

In one of the possible or preferred embodiments, the first line area includes a first boundary that corresponds to the bent section, and the first boundary has a first bent line formed by a first convex portion, a first connection portion and a first concave portion, and two ends of the first connection portion are respectively connected to the first convex portion and the first concave portion.

In one of the possible or preferred embodiments, a first rotation angle from the first convex portion to the first connection portion is less than or equal to 90 degrees, and a second rotation angle from the first connection portion to the first concave portion is less than or equal to 90 degrees.

In one of the possible or preferred embodiments, the second line area includes a second boundary that corresponds to the bent section, and the second boundary is parallel to the first boundary.

In one of the possible or preferred embodiments, a plurality of first holes are formed on a surface of the first metal circuit layer, and the plurality of first holes are adjacent to at least one of the first convex portion and the first concave portion.

In one of the possible or preferred embodiments, the first hole is a depression, a blind hole or a through hole.

In one of the possible or preferred embodiments, the circuit board further includes an electronic component located on the first metal circuit layer, a plurality of first holes are formed on a surface of the first metal circuit layer, and the plurality of first holes are adjacent to the electronic component.

In one of the possible or preferred embodiments, the first hole is a depression, a blind hole or a through hole.

In one of the possible or preferred embodiments, the circuit board further includes a second metal circuit layer located on the lower surface.

In one of the possible or preferred embodiments, a thickness of the second metal circuit layer is different from a thickness of the first metal circuit layer.

Therefore, in the circuit board provided by the present disclosure, by virtue of "the first line area and the second line area being separated by a groove area, and the groove area including a bent section," stress concentration point can be removed, and stress concentration can be eliminated or reduced, thereby decreasing the risk of delamination or detachment between the metal circuit layer and the substrate.

Further, in the circuit board provided by the present disclosure, by virtue of "forming a plurality of first holes," "the plurality of first holes being adjacent to the first convex portion and the first concave portion," and "the plurality of first holes being adjacent to the electronic component," the stress concentration can be eliminated or reduced, thereby decreasing the risk of delamination or detachment between the metal circuit layer and the substrate.

Further, in the circuit board provided by the present disclosure, by virtue of "a thickness of the first metal circuit layer being different from a thickness of the second metal circuit layer," the degree of warpage between the metal circuit layer and the substrate can be decreased, and generation of stress can be reduced, thereby decreasing the risk of delamination or detachment between the metal circuit layer and the substrate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
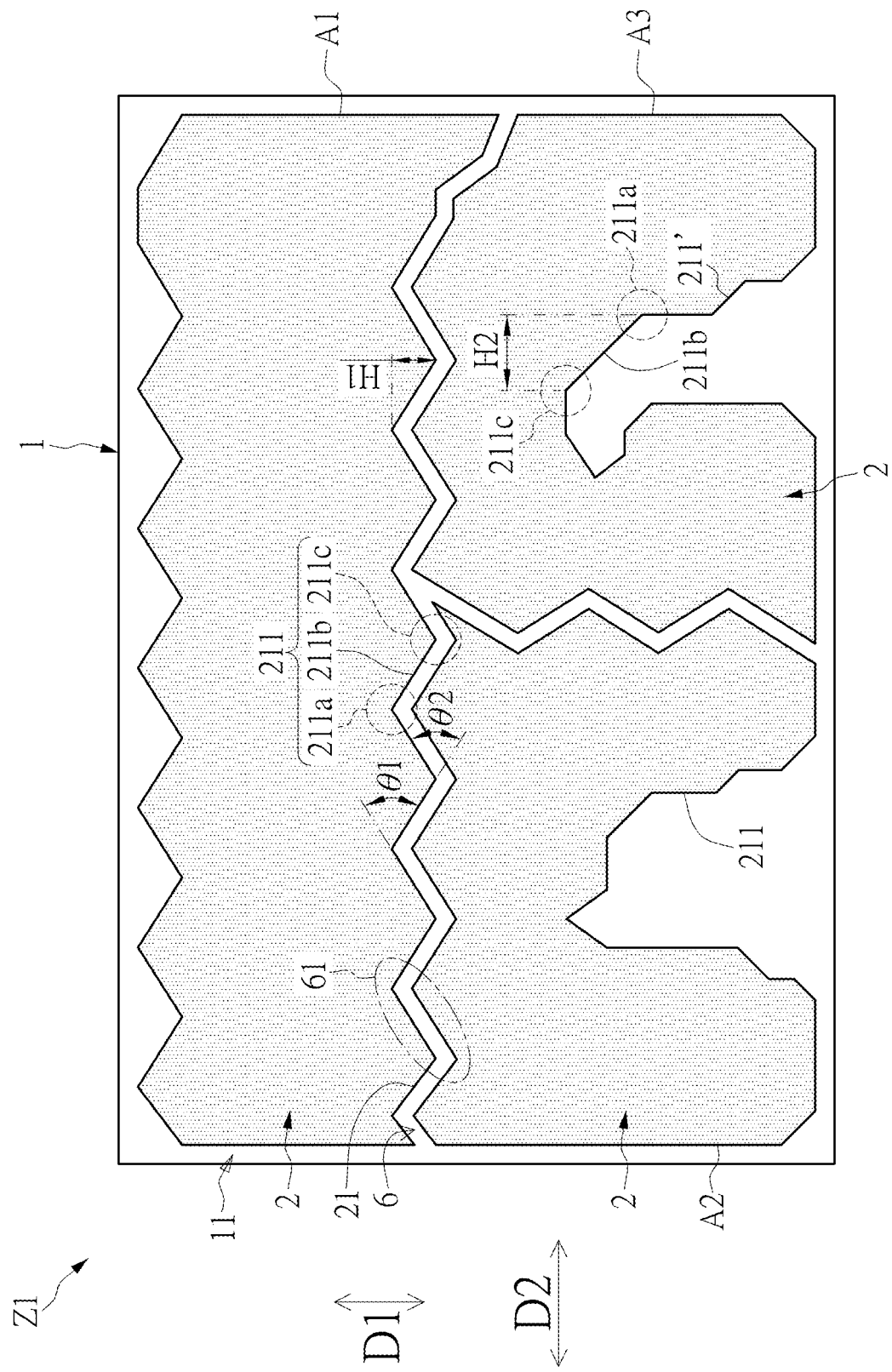
FIG. 1 is a top view of a circuit board according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 8:
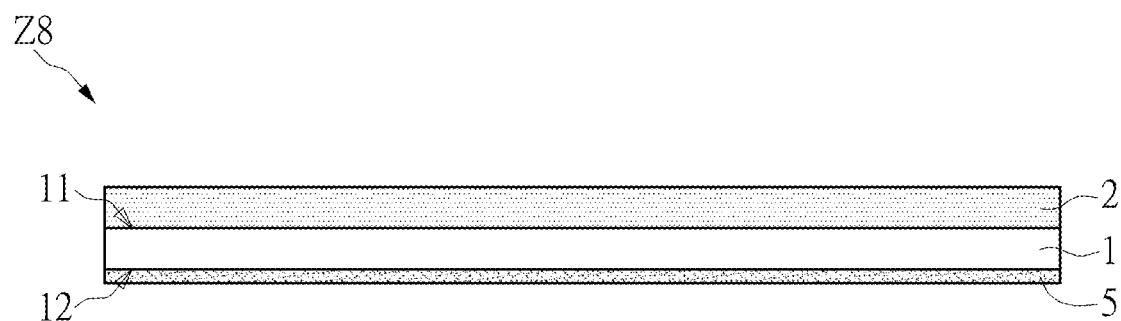
FIG. 8 is a side view of the circuit board according to one embodiment of the present disclosure.

Reference is made to FIG. 1, which is a top view of a circuit board Z1 according to one embodiment of the present disclosure. The circuit board Z1 includes a substrate 1 and a first metal circuit layer 2. The substrate 1 has an upper surface 11 and a lower surface 12 opposite to the upper surface 1 (as shown in FIG. 8). The first metal circuit layer 2 includes a first line area A1 and a second line area A2. The first line area A1 is separated from the second line area A2 by a groove area 6, and the groove area 6 includes a bent section 61.

The substrate 1 can be, but not limited to, a circuit board. In certain embodiments, the substrate 1 is made of fiberglass or plastic. The first metal circuit layer 2 can be, but not limited to, a copper foil layer. As shown in FIG. 1, in the present embodiment, the first metal circuit layer 2 further includes a third line area A3. The bent section 61 corresponds to a first boundary 21 included in the first line area A1. The first boundary 21 has a first bent line 211, and the first bent line 211 has a first convex portion 211a, a first connection portion 211b and a first concave portion 211c. Two ends of the first connection portion 211b are respectively connected to the first convex portion 211a and the first concave portion 211c. The first line area A1 in the first metal circuit layer 2 is taken as an example in the present embodiment. The first convex portion 211a and the first concave portion 211c are angular-shaped, and the angular shape can be an acute angle or an obtuse angle (not limited in the present disclosure). As shown in FIG. 1, a first rotation angle θ 1 from the first convex portion 211a to the first connection portion 211b can be less than or equal to 90 degrees, and a second rotation angle θ 2 from the first connection portion 211b to the first concave portion 211c can be less than or equal to 90 degrees. Two adjacent ones of the first convex portions 211a can have the same or different shapes (i.e., the first rotation angles θ 1 may be the same or different from each other), and two adjacent ones of the first concave portions 211c can also have the same or different shapes (i.e., the second rotation angles θ 2 may be the same or different from each other). However, the present disclosure is not limited thereto. In the embodiment shown in FIG. 1, the first connection portion 211b is a straight line, and the two ends of the first connection portion 211b are respectively connected to the first convex portion 211a and the first concave portion 211c. In other embodiments, the first connection portion 211b is a curved line. A first distance H1 is defined between a top end of the first convex portion 211a and a bottom end of the first concave portion 211c that are connected to each other in a first direction D1. The first distances H1 may be the same or different from each other. In the present embodiment shown in FIG. 1, the first distances H1 are not equal in length. Through the structure of the first bent line 211, stress concentration can be eliminated or reduced, and the first metal circuit layer 2 can be protected, so as to prevent separation from the substrate 1 or occurrence of warpage.

Figure 2:
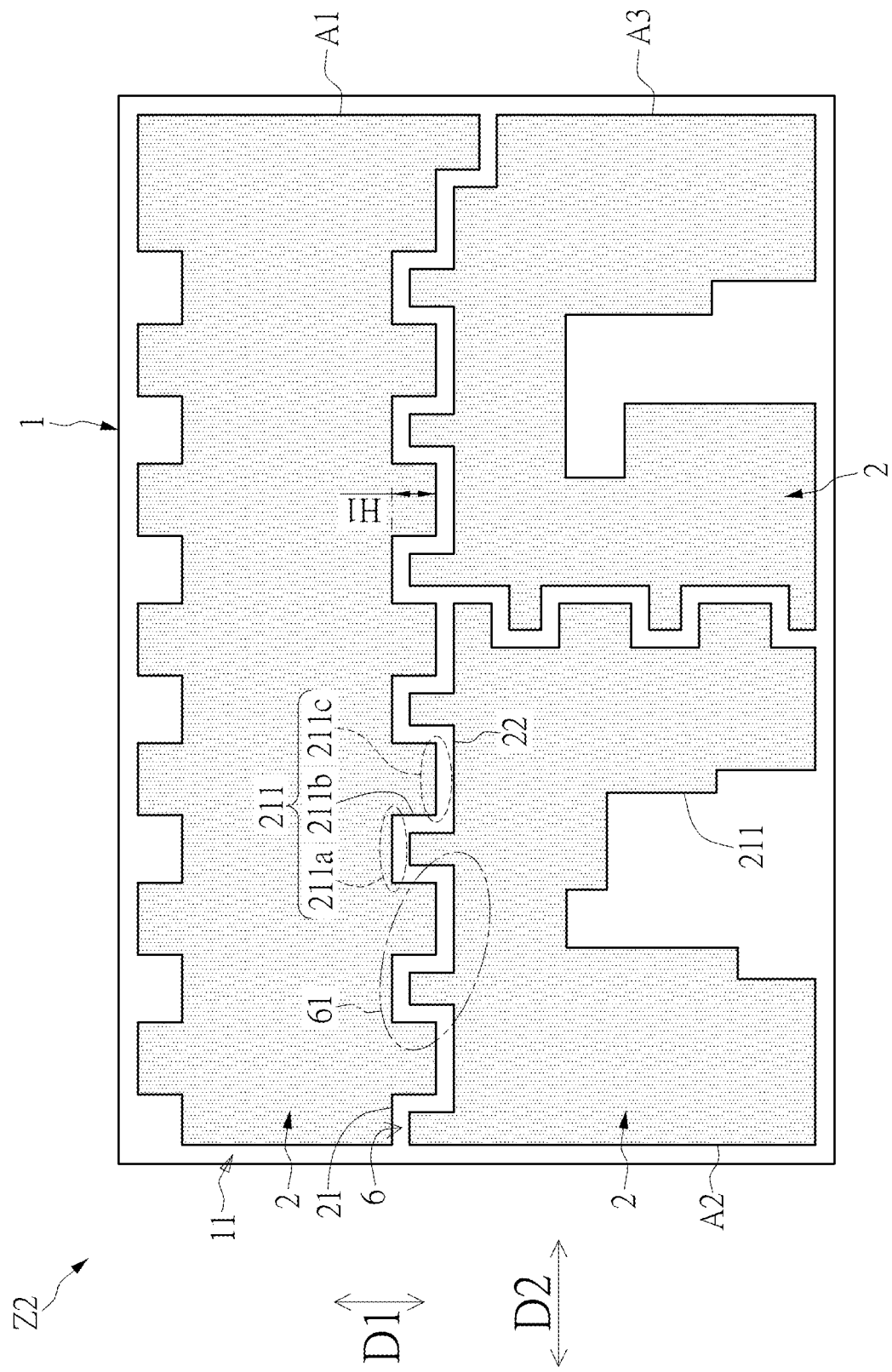
FIG. 2 is a top view of the circuit board according to one embodiment of the present disclosure.

Reference is made to FIG. 2, which is a top view of a circuit board Z2 according to one embodiment of the present disclosure. According to the present embodiment, the first convex portion 211a and the first concave portion 211c are substantially in the shape of an inverted letter "U". Two adjacent ones of the first convex portions 211a can have the same or different shapes, and two adjacent ones of the first concave portions 211c can have the same or different shapes. Here, the shape includes the size (the present disclosure has no limitation in this regard), and the shape is decided based on a pattern of the first metal circuit layer 2 as required by a user. In addition, according to the embodiment shown in FIG. 2, the second line area A2 includes a second boundary 22 that corresponds to the bent section 6, and the second boundary 22 is parallel to the first boundary 21 of the first line area A1. In other words, a partial line section or an entire line section of the first boundary 21 and a partial line section or an entire line section the second boundary 22 are spaced apart from each other by the same distance.

Figure 3:
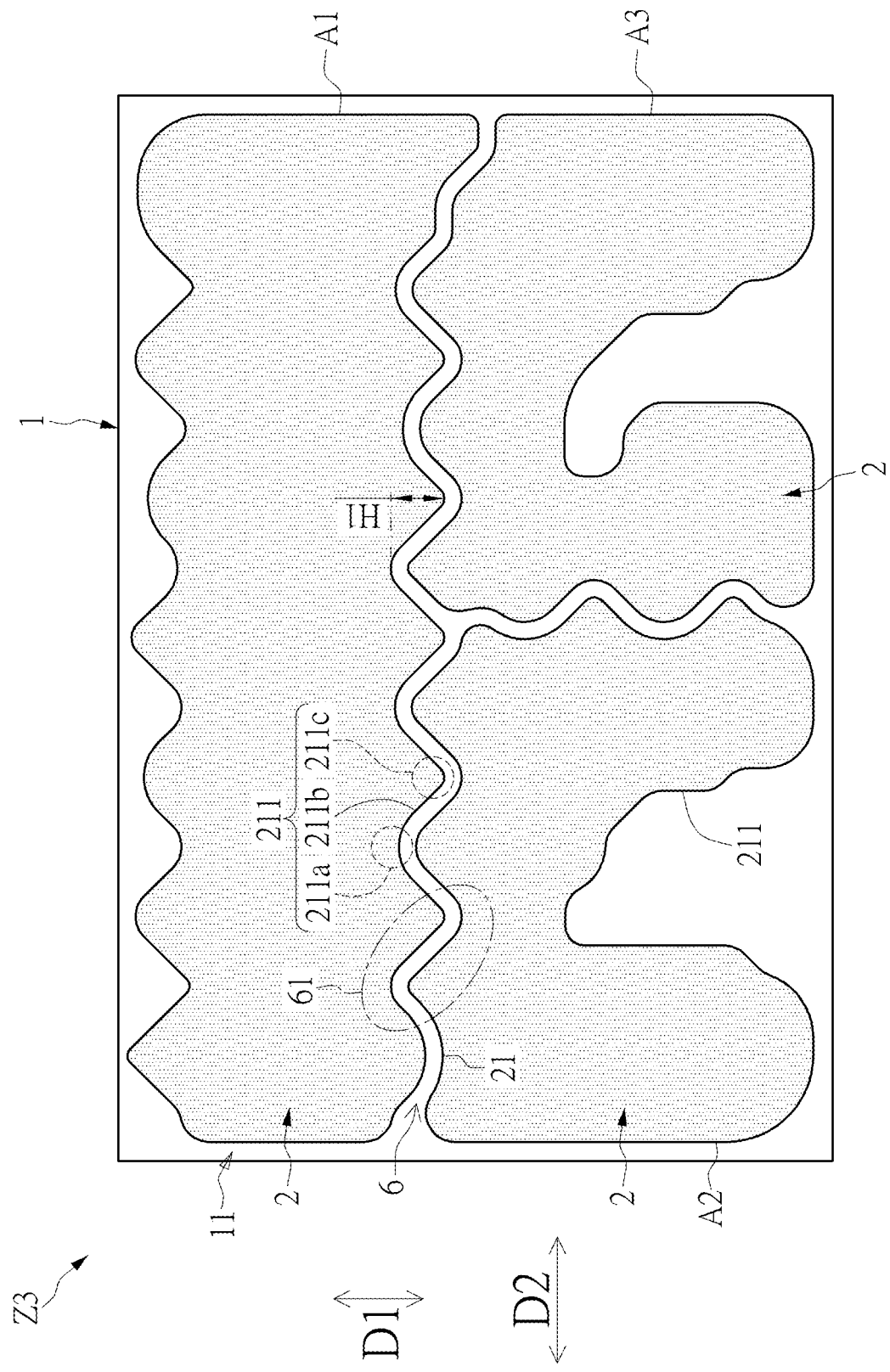
FIG. 3 is a top view of the circuit board according to one embodiment of the present disclosure.
Figure 4:
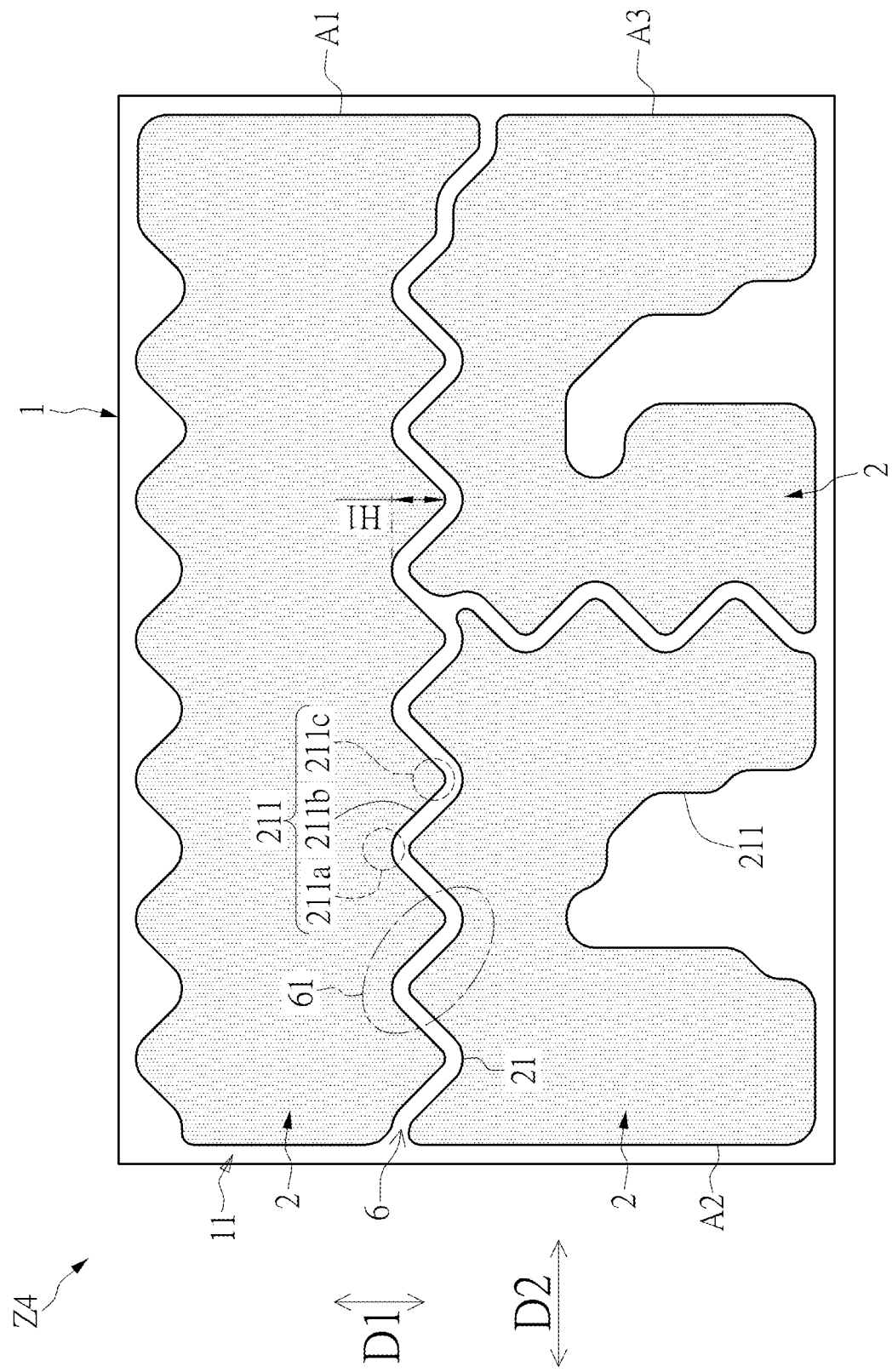
FIG. 4 is a top view of the circuit board according to one embodiment of the present disclosure.

Referring to FIG. 3 and FIG. 4, FIG. 3 is a top view of a circuit board Z3 according to one embodiment of the present disclosure, and FIG. 4 is a top view of a circuit board Z4 according to one embodiment of the present disclosure. According to the embodiment shown in FIG. 3, the first convex portion 211a and the first concave portion 211c are each a curved line, and have a crest shape and a trough shape, respectively. The first connection portion 211b may be a straight line or a curved line, but the present disclosure is not limited thereto. In the embodiment shown in FIG. 3, the first bent lines 211 are connected in series to form a wave shape. The first convex portions 211a are different (or partially the same) in shape, and the first concave portions 211c are different (or partially the same) in shape. The first distances H1 can be the same or different from each other (the present disclosure has no limitation in this regard), which is decided based on the pattern of the first metal circuit layer 2 as required by the user. The embodiment shown in FIG. 4 is different from the embodiment shown in FIG. 3 in that the first convex portions 211a have the same shape and size, the first concave portions 211c have the same shape and size, and the first distances H1 are the same. The circuit boards shown in FIG. 3 and FIG. 4 both have the effect of eliminating or reducing the stress concentration, so as to protect the first metal circuit layer 2.

Figure 5:
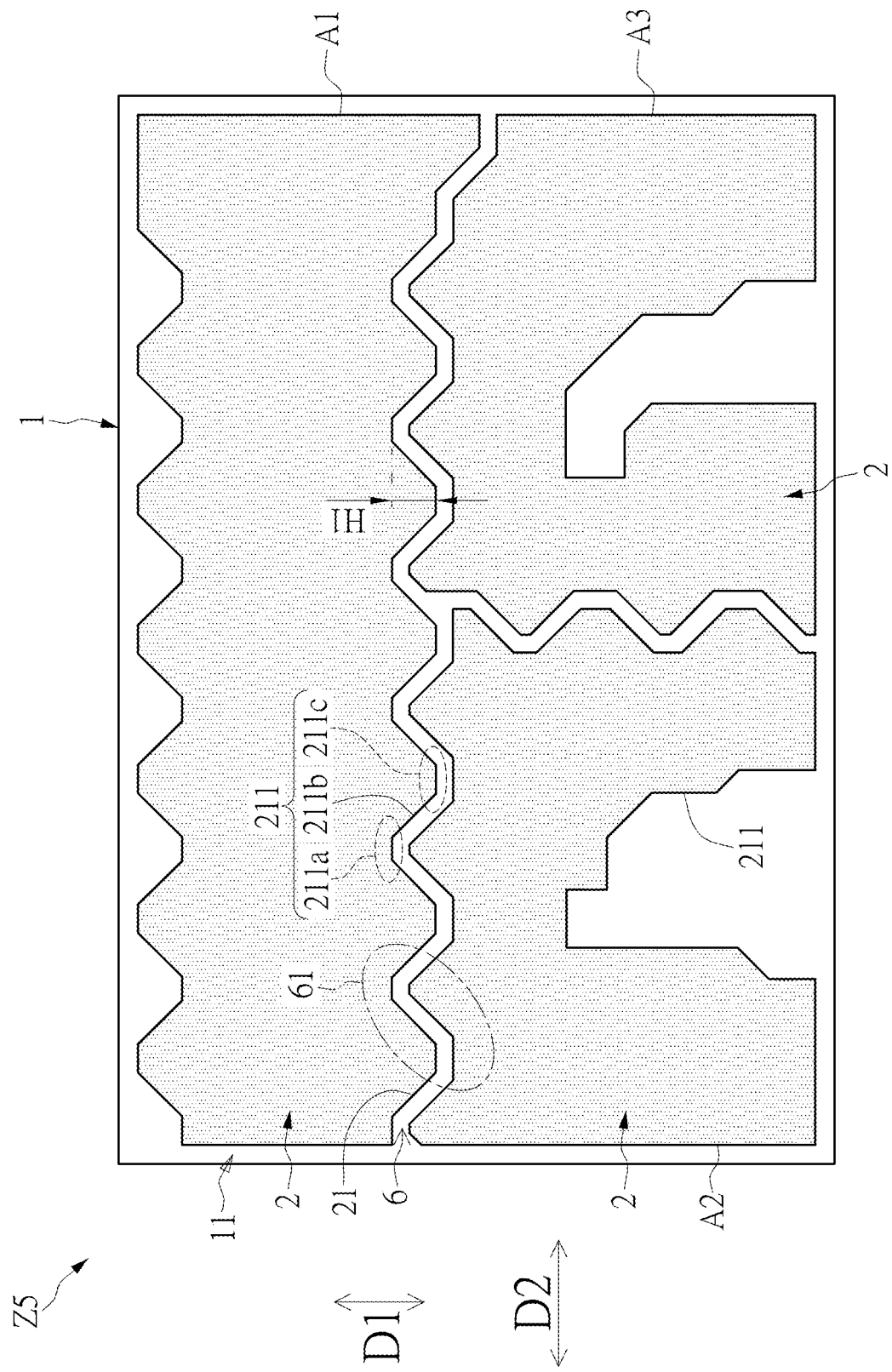
FIG. 5 is a top view of the circuit board according to one embodiment of the present disclosure.
Figure 6:
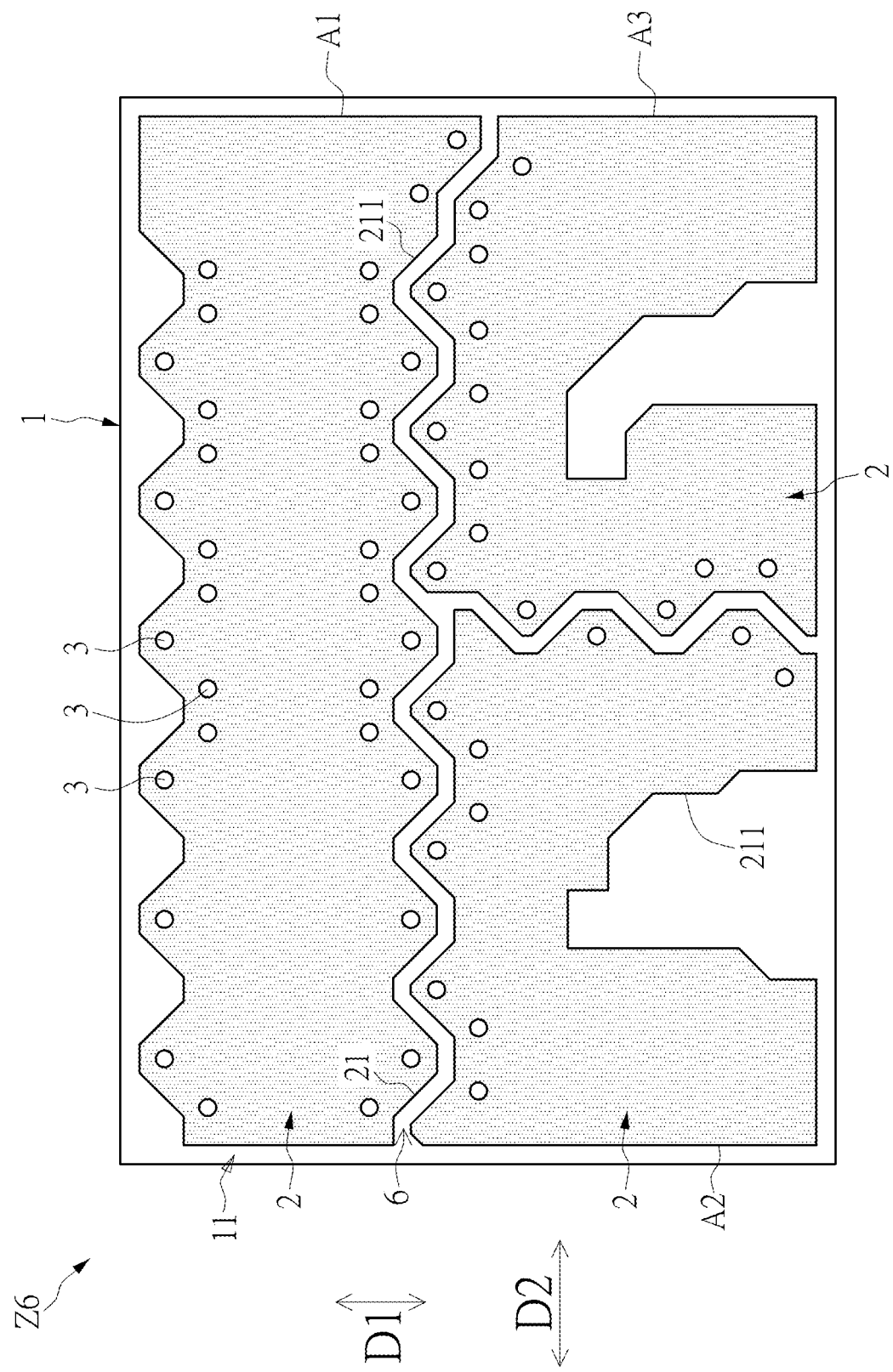
FIG. 6 is a top view of the circuit board according to one embodiment of the present disclosure.

Referring to FIG. 5 and FIG. 6, FIG. 5 is a top view of a circuit board Z5 according to one embodiment of the present disclosure, and FIG. 6 is a top view of a circuit board Z6 according to one embodiment of the present disclosure. In the embodiments shown in FIG. 5 and FIG. 6, the first convex portion 211a and the first concave portion 211c are substantially in the shape of a trapezoid, the top end of the first convex portion 211a is a straight line, and the bottom end of the first concave portion 211c is also a straight line. These two straight lines are parallel to each other. In these two embodiments, the first convex portions 211a are the same in shape and size, and the first convex portions 211c have the same shape and size. The first distances H1 are also the same. The embodiment shown in FIG. 6 is different from the embodiment shown in FIG. 5 in that a plurality of first holes 3 are provided on a surface of the first metal circuit layer 2 of the circuit board Z6, and that the first holes 3 are adjacent to the first convex portion 211a and the first concave portion 211c. The first holes 3 are formed to aid in removing or dispersing a stress concentration point, so as to reduce the risk of detachment between the first metal circuit layer 2 and the substrate 1 or the occurrence of warpage. In certain embodiments, the first hole 3 is a depression. In other embodiments, the first hole 3 is a blind hole, which only passes through the first metal circuit layer 2 and extends into the substrate 1. However, the present disclosure is not limited thereto. In some embodiments, the first hole 3 is a through hole that penetrates through the first metal circuit layer 2 and the substrate 1.

Figure 7:
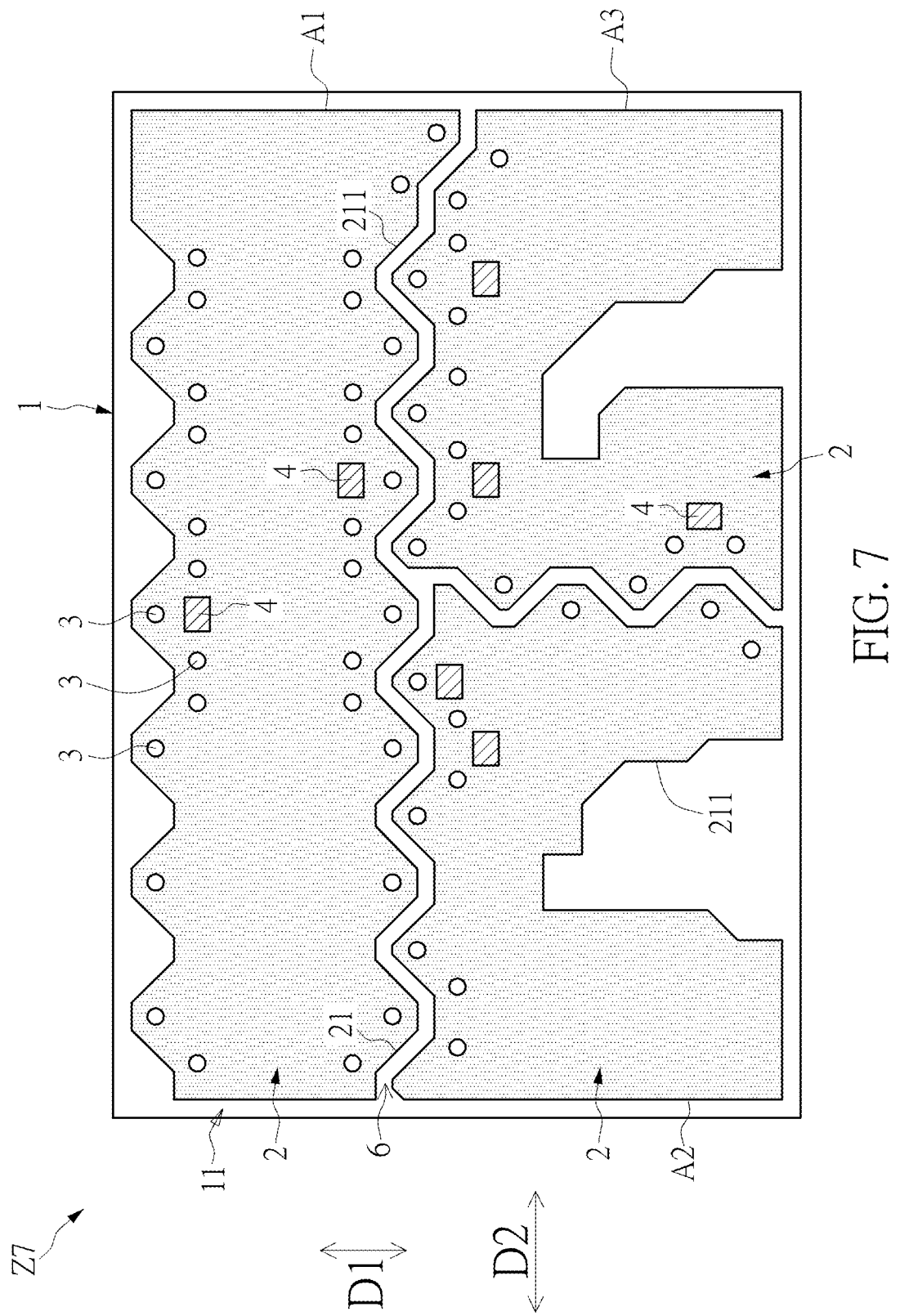
FIG. 7 is a top view of the circuit board according to one embodiment of the present disclosure.

Reference is made to FIG. 7, which is a top view of a circuit board Z7 according to one embodiment of the present disclosure. In the present embodiment, the circuit board Z7 includes a plurality of electronic components 4 located on the first metal circuit layer 2. The first holes 3 are formed on the surface of the first metal circuit layer 2, and the first holes 3 are adjacent to the electronic components 4. The electronic components 4 generate heat energy during operation, such that a thermal stress is generated on the circuit board Z7. The first holes 3 are formed around the electronic components 4 to remove or disperse the stress concentration, so as to prevent separation of the first metal circuit layer 2 from the substrate 1.

Figure 9:
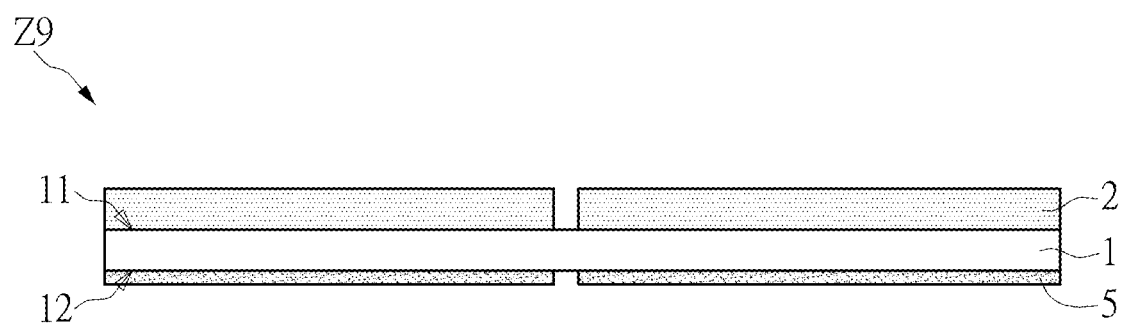
FIG. 9 is a side view of the circuit board according to one embodiment of the present disclosure.

Referring to FIG. 8 and FIG. 9, FIG. 8 is a side view of a circuit board Z8 according to one embodiment of the present disclosure, and FIG. 9 is a side view of a circuit board Z9 according to one embodiment of the present disclosure. According to the embodiment shown in FIG. 8, the circuit board Z8 further includes a second metal circuit layer 5 located on the lower surface 12, and the second metal circuit layer 5 includes one or more line areas (not shown in the figures). A thickness of the second metal circuit layer 5 is different from a thickness of the first metal circuit layer 2. Regarding the line area of the second metal circuit layer 5, reference can be made to the descriptions of the first line area A1, the second line area A2, or the third line area A3 mentioned above, and details thereof will not be repeated herein. As shown in FIG. 8, the thicknesses of the first metal circuit layer 2 is different from the thickness of the second metal circuit layer 5. The thickness of the first metal circuit layer 2 is greater than the thickness of the second metal circuit layer 5, and a volume ratio of the first metal circuit layer 2 to the second metal circuit layer 5 ranges from 80% to 100% (a volume of the first metal circuit layer 2 may be larger or smaller than a volume of the second metal circuit layer 5). In other embodiments, the thickness of the first metal circuit layer 2 is less than the thickness of the second metal circuit layer 5, but the present disclosure is not limited thereto. When the volume ratio of the first metal circuit layer 2 to the second metal circuit layer 5 ranges from 80% to 100%, the risk of warpage caused by heat (due to thermal expansion coefficients between the metal circuit layer and the substrate 1 being different) can be reduced, and the risk of detachment of the first metal circuit layer 2 and the second metal circuit layer 5 from the substrate 1 can be reduced.

According to the embodiment shown in FIG. 9, in the circuit board Z9, the line area of the second metal circuit layer 5 is mirror-symmetrical to the line area of the first metal circuit layer 2 (e.g., the first line area A1, the second line area A2 and the third line area A3). That is to say, the thickness of the first metal circuit layer 2 is different from the thickness of the second metal circuit layer 5, but a pattern of the second metal circuit layer 5 is the same as the pattern of the first metal circuit layer 2.

Further, as the first metal circuit layer 2 mentioned above, two line areas of the second metal circuit layer 5 are separated by a second groove area (not shown in the figures), and the second groove area also includes a bent section. The line area includes a third boundary that corresponds to the bent section. The third boundary has a second bent line, and the second bent line is formed by a second convex portion, a second connection portion, and a second concave portion. Two ends of the second connection portion are respectively connected to the second convex portion and the second concave portion. Similarly, regarding the second bent line, the second convex portion, the second connection portion, and the second concave portion, reference can be made to the descriptions of the first bent line 211, the first convex portion 211a, the first connection portion 211b, and the first concave portion 211c mentioned above.

Similarly, in certain embodiments, a plurality of second holes are formed on a surface of the second metal circuit layer 5, and the second holes are adjacent to at least one of the second convex portion and the second concave portion. In other embodiments, the circuit board Z further includes an electronic component (not shown in the figures) located on the second metal circuit layer 5. The second holes are formed adjacent to the electronic component. The second hole can be a depression, a blind hole, or a through hole. Formation of the second holes allows removal or dispersion of the stress concentration point, so as to reduce the risk of detachment between the second metal circuit layer 5 and the substrate 1 or the occurrence of warpage.

It should be noted that, according to certain embodiments, the first bent line 211 includes multiple ones of the first convex portion 211a, multiple ones of the first connection portion 211b, and multiple ones of the first concave portion 211c. The first convex portions 211a can have the same or different shapes. For example, some of the first convex portions 211a are angular-shaped, and some of the first convex portions 211a are wave-shaped or in the shape of an inverted letter "U". The first connection portions 211b can have the same or different shapes. For example, some of the first connection portions 211b are a straight line, and some of the first connection portions 211b are a curved line. The first concave portions 211c can have the same or different shapes. For example, some of the first concave portions 211c are angular-shaped, and some of the first concave portions 211c are wave-shaped or U-shaped. The second bent line is also configured in the aforementioned manner, but the present disclosure is not limited thereto. For example, in the third line area A3 of the metal circuit layer 2 shown in the embodiment of FIG. 1, the first boundary 21 has an irregular first bent line 211', and the first convex portion 211a, the first connection portion 211b and the first concave portion 211c of the first bent line 211' are different in shape. Along a second direction D2, a second distance H2 is defined between the top end of the first convex portion 211a and the bottom end of the first concave portion 211c. The second distances H2 may be the same or different from each other.

Beneficial Effects of the Embodiments

In conclusion, in the circuit board provided by the present disclosure, by virtue of "the first line area A1 and the second line area A2 being separated by the groove area 6, and the groove area 6 including the bent section 61," the stress concentration point can be removed, and the stress concentration can be eliminated or reduced, thereby decreasing the risk of delamination or detachment between the metal circuit layer and the substrate 1.

Further, in the circuit board provided by the present disclosure, by virtue of "forming the first holes 3," "the first holes 3 being adjacent to the first convex portion 211a and the first concave portion 211c," and "the first holes 3 being adjacent to the electronic component 4," the stress concentration can be eliminated or reduced, thereby decreasing the risk of delamination or detachment between the metal circuit layer and the substrate 1.

Further, in the circuit board provided by the present disclosure, by virtue of "the thickness of the first metal circuit layer 2 being different from the thickness of the second metal circuit layer 5," the degree of warpage between the metal circuit layer and the substrate 1 can be decreased, and generation of stress can be reduced, thereby decreasing the risk of delamination or detachment between the metal circuit layer and the substrate 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit board, comprising:
   a substrate having an upper surface and a lower surface opposite to the upper surface; and
   a first metal circuit layer located on the upper surface, wherein the first metal circuit layer includes a first area and a second area;
   wherein the first area and the second area are separated by a linear groove area, and the groove area defines a plurality of alternating bent sections;
   wherein the first area has a first boundary formed with a plurality of repetitive protruding patterns, each of the protruding patterns is defined by a first bent line having a first convex portion, a first connection portion, and a first concave portion;
   wherein each of the plurality of protruding patterns has identical shape and size; and
   wherein a distance defined between each of the first convex portion and the corresponding first concave portion of the plurality of the protruding patterns are identical.

2. The circuit board according to claim 1, wherein a first rotation angle from the first convex portion to the first connection portion is less than or equal to 90 degrees, and a second rotation angle from the first connection portion to the first concave portion is less than or equal to 90 degrees.

3. The circuit board according to claim 1, wherein the second area includes a second boundary that corresponds to the bent section, and the second boundary is parallel to the first boundary.

4. The circuit board according to claim 1, wherein a plurality of first holes are formed on a surface of the first metal circuit layer, and the plurality of first holes are adjacent to at least one of the first convex portion and the first concave portion.

5. The circuit board according to claim 4, wherein the first hole is a depression, a blind hole, or a through hole.

6. The circuit board according to claim 1, further comprising an electronic component located on the first metal circuit layer, wherein a plurality of first holes are formed on a surface of the first metal circuit layer, and the plurality of first holes are adjacent to the electronic component.

7. The circuit board according to claim 6, wherein the first hole is a depression, a blind hole, or a through hole.

8. The circuit board according to claim 1, further comprising a second metal circuit layer located on the lower surface.

9. The circuit board according to claim 8, wherein a thickness of the second metal circuit layer is different from a thickness of the first metal circuit layer.

10. A circuit board, comprising:
    a substrate having an upper surface and a lower surface opposite to the upper surface; and
    a first metal circuit layer located on the upper surface, wherein the first metal circuit layer includes a first area and a second area;
    wherein the first area and the second area are separated by a linear groove area, and the groove area defines a plurality of alternating bent sections having a regular pitch distance;
    wherein the groove area traverses between the first area and the second area across a width of the substrate.

11. The circuit board according to claim 10, wherein the first area includes a first boundary that corresponds to the bent section, the first boundary has a first bent line having a first convex portion, a first connection portion, and a first concave portion, and two ends of the first connection portion are respectively connected to the first convex portion and the first concave portion.

12. The circuit board according to claim 10, wherein a plurality of first holes are formed on a surface of the first metal circuit layer, and the plurality of first holes are adjacent to at least one of the first convex portion and the first concave portion.

13. The circuit board according to claim 12, wherein the first hole is a depression, a blind hole, or a through hole.

14. The circuit board according to claim 10, further comprising an electronic component located on the first metal circuit layer, wherein a plurality of first holes are formed on a surface of the first metal circuit layer, and the plurality of first holes are adjacent to the electronic component.

15. The circuit board according to claim 14, wherein the first hole is a depression, a blind hole, or a through hole.

* * * * *